United States Patent
Lin

(10) Patent No.: US 6,764,264 B2
(45) Date of Patent: Jul. 20, 2004

(54) FEMALE SCREW DEVICE PICKABLE BY A SMT AUTOMATIC MACHINE

(76) Inventor: Chiang Chun Lin, 4F, No. 282 Chung Shan 1st Rd., Lu Chou City, Taipei Hsien (TW)

( * ) Notice: Subject to any disclaimer, the term of this patent is extended or adjusted under 35 U.S.C. 154(b) by 0 days.

(21) Appl. No.: 10/270,589

(22) Filed: Oct. 16, 2002

(65) Prior Publication Data

US 2004/0076491 A1 Apr. 22, 2004

(51) Int. Cl.[7] ................................ F16B 37/14

(52) U.S. Cl. ................ 411/431; 411/377; 411/908

(58) Field of Search ................ 411/377, 429, 411/431, 908, 910, 171, 780, 181, 372.5, 372.6, 373

(56) References Cited

U.S. PATENT DOCUMENTS

| | | | | | |
|---|---|---|---|---|---|
| 2,551,834 A | * | 5/1951 | Ferguson | ............ | 411/431 X |
| 5,082,409 A | * | 1/1992 | Bias | ............ | 411/431 |
| 5,290,131 A | * | 3/1994 | Henriksen | ............ | 411/377 X |
| 5,810,532 A | * | 9/1998 | Huang | ............ | 411/431 |
| 5,857,818 A | * | 1/1999 | Bias, Sr. | ............ | 411/431 |

* cited by examiner

Primary Examiner—Neill Wilson
(74) Attorney, Agent, or Firm—Browdy and Neimark, P.L.L.C.

(57) ABSTRACT

A female screw rod is constructed to include a female screw rod adapted for mounting in a mounting hole of a motherboard to support an object above the motherboard, the female screw rod having an axially extended screw hole for the installation of a screw, and a quick-release cap connectable to the female screw rod to block the screw hole, the quick-release cap having a downwardly extended barrel-like coupling portion for capping on the female screw rod.

3 Claims, 6 Drawing Sheets

FEMALE SCREW DEVICE PICKABLE BY A SMT AUTOMATIC MACHINE

BACKGROUND OF THE INVENTION

1. Field of the Invention

The present invention relates to a female screw device and, more particularly, to such a female screw device, which is practical for installation in a motherboard by a SMT (surface mounting technique) automatic machine.

2. Description of the Related Art

A computer motherboard has a plurality of mounting holes for the mounting of female screw rods to support a circuit board or any of a variety of electronic devices above the motherboard. After insertion of female screw rods into the respective mounting holes, screws are respectively mounted in the female screw rods to fixedly secure the circuit board or electronic device in place. After installation of related parts in the motherboard, the motherboard is delivered to a tin soldering stove to receive a soldering process. According to current motherboard fabrication methods, electronic components are automatically installed in the motherboard by SMT (surface mounting technique. However, because female screw rods have a screw hole extended through the top and bottom sides thereof, they cannot be automatically sucked by the vacuum suction unit of a SMT automatic machine for quick installation in the motherboard. Therefore, workers achieve the installation of female screw rods manually. This manual installation procedure takes much time and labor and, cannot eliminate human errors.

SUMMARY OF THE INVENTION

The present invention has been accomplished under the circumstances in view. It is the main object of the present invention to provide a female screw device, which is practical for installation in a motherboard by a SMT (surface mounting technique) automatic machine without interfering with the installation of other electronic parts in the motherboard. To achieve this and other objects of the present invention, the female screw device comprises a female screw rod adapted for mounting in a mounting hole of a motherboard to support an object above the motherboard, the female screw rod having a screw hole axially extended through top and bottom sides thereof, and a quick-release cap connectable to the female screw rod, the quick-release cap comprising a cap body adapted to block the screw hole of the female screw rod, and a hollow coupling portion downwardly extended from the cap body and adapted to be capped on the female screw rod.

DETAILED DESCRIPTION OF THE PREFERRED EMBODIMENT

Figure 1:
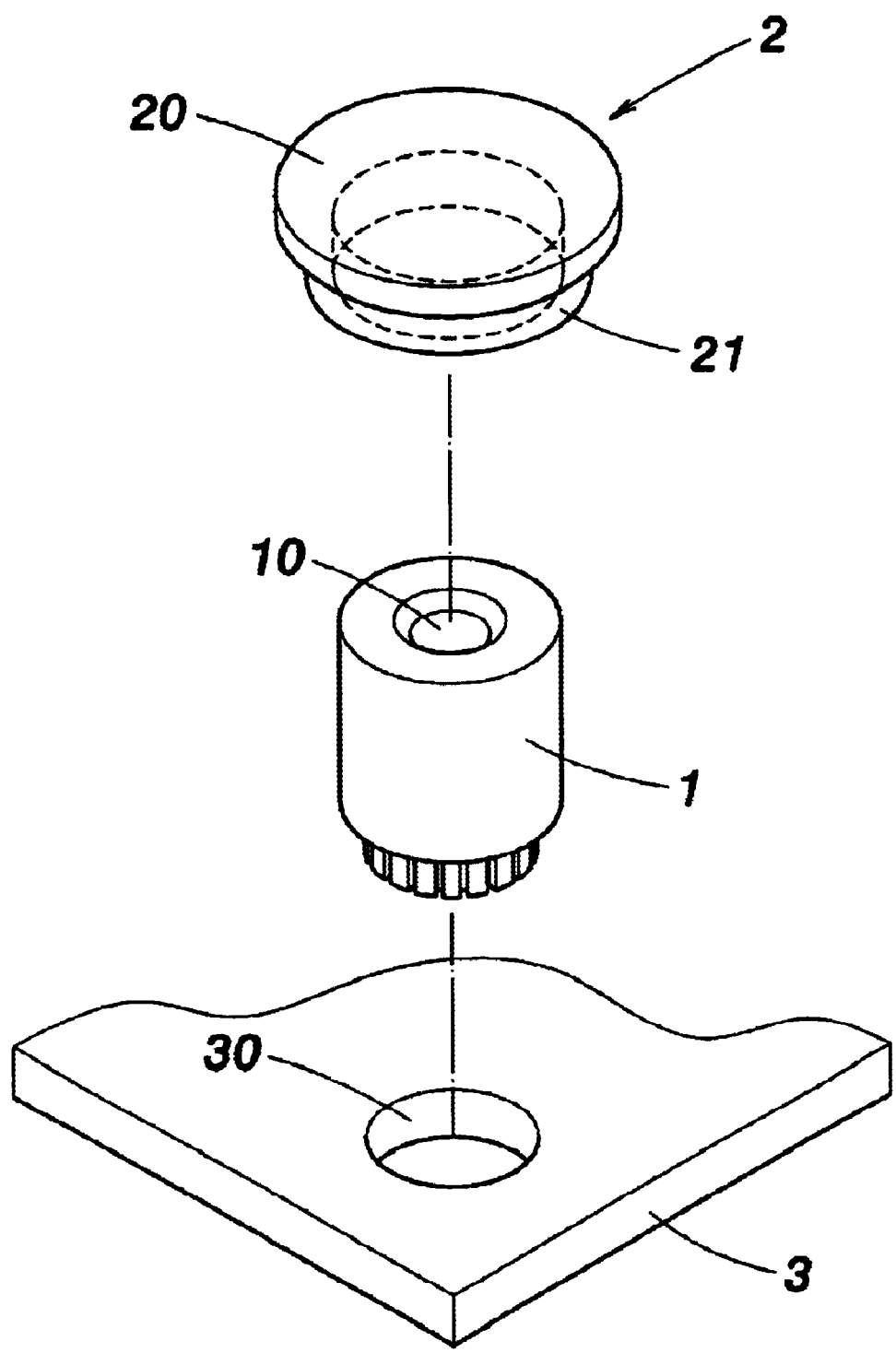
FIG. 1 is a perspective exploded view of a female screw device relative to a mounting hole in a motherboard according to the present invention.
Figure 2:
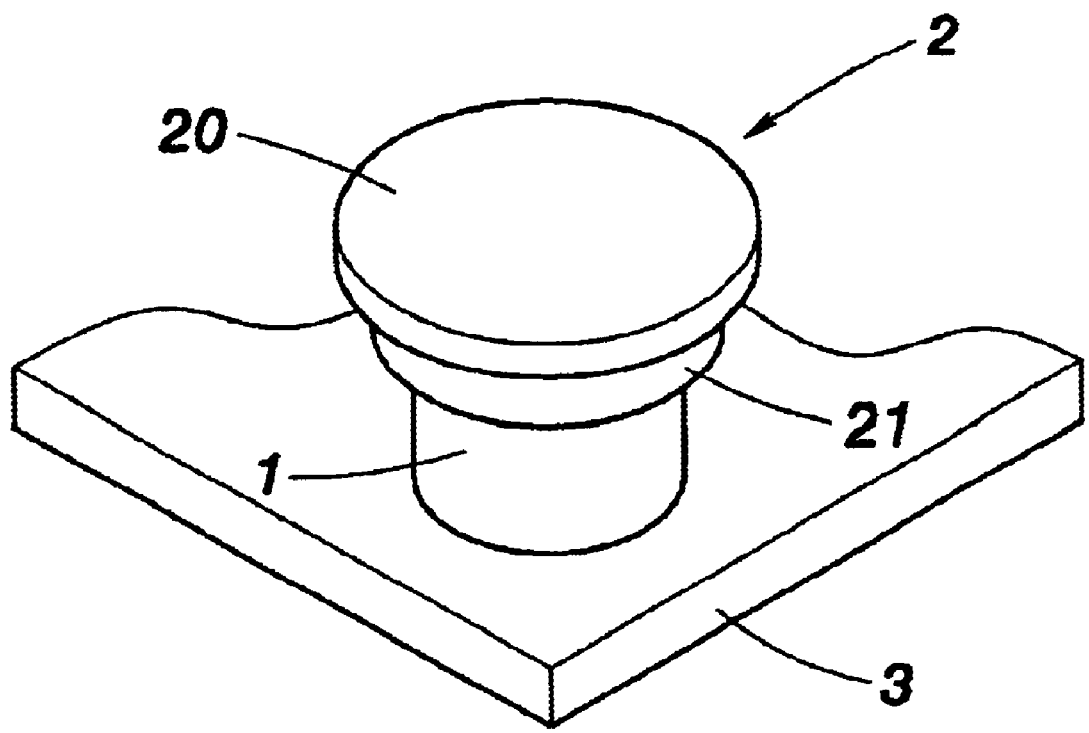
FIG. 2 is an assembly view of FIG. 1.
Figure 3:
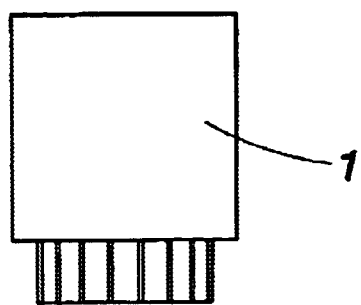
FIG. 3 is a side view of the female screw rod fore the female screw device according to the present invention.
Figure 4:
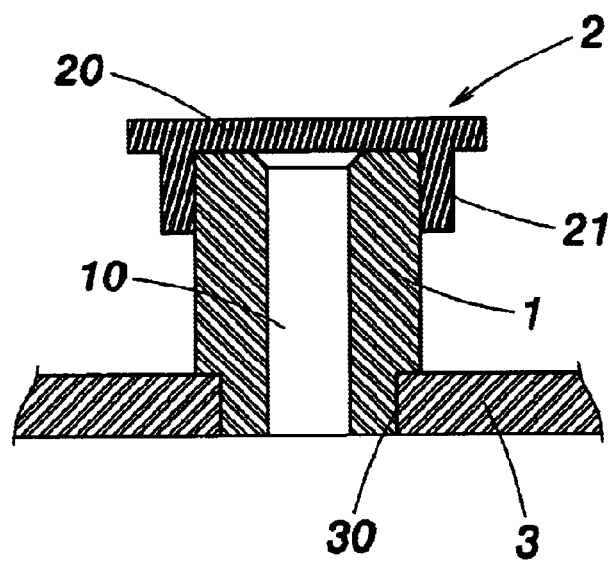
FIG. 4 is a side view in section of FIG. 2.

Referring to FIGS. from 1 through 4, a female screw device in accordance with the present invention is shown comprised of a female screw rod 1, and a quick-release cap 2.

The female screw rod 1 is adapted for fastening to one mounting hole 30 in a motherboard 3, having a screw hole 10 axially extended through the top and bottom sides.

The quick-release cap 2 is made of a heat resistant rubber or plastics, comprising a cap body 20 adapted to block the screw hole 10 of the female screw rod 1, and a coupling portion 21 downwardly extended from the bottom side of the cap body 20. According to this embodiment, the coupling portion 21 is shaped like a barrel fitting the outer diameter of the female screw rod 1.

Before installation of the female screw rod 1 in the mounting hole 30 of the motherboard 1, the barrel-like coupling portion 21 of the quick-release cap 2 is capped on the top end of the female screw rod 1 to block the screw holes 10. Thus, the female screw device can be sucked by the vacuum suction unit of the SMT automatic machine and then automatically installed in the mounting hole 30 of the motherboard 3. During installation of the female screw device, the quick-release cap 2 does not interfere with other electronic components of the motherboard 3. Further, when the motherboard 3 receiving a tin soldering process in a SMT soldering stove, the soldering process does not affect the physical properties of the quick-release cap 2 and its positioning in the female screw rod 1. After SMT, use a pry or the like to remove the quick-release cap 2 from the female screw rod 1 for enabling a screw to be mounted in the screw hole 10 of the female screw rod 1 to secure the desired object to the motherboard 3 and to keep the object spaced from the motherboard 3 at a distance.

Figure 5:
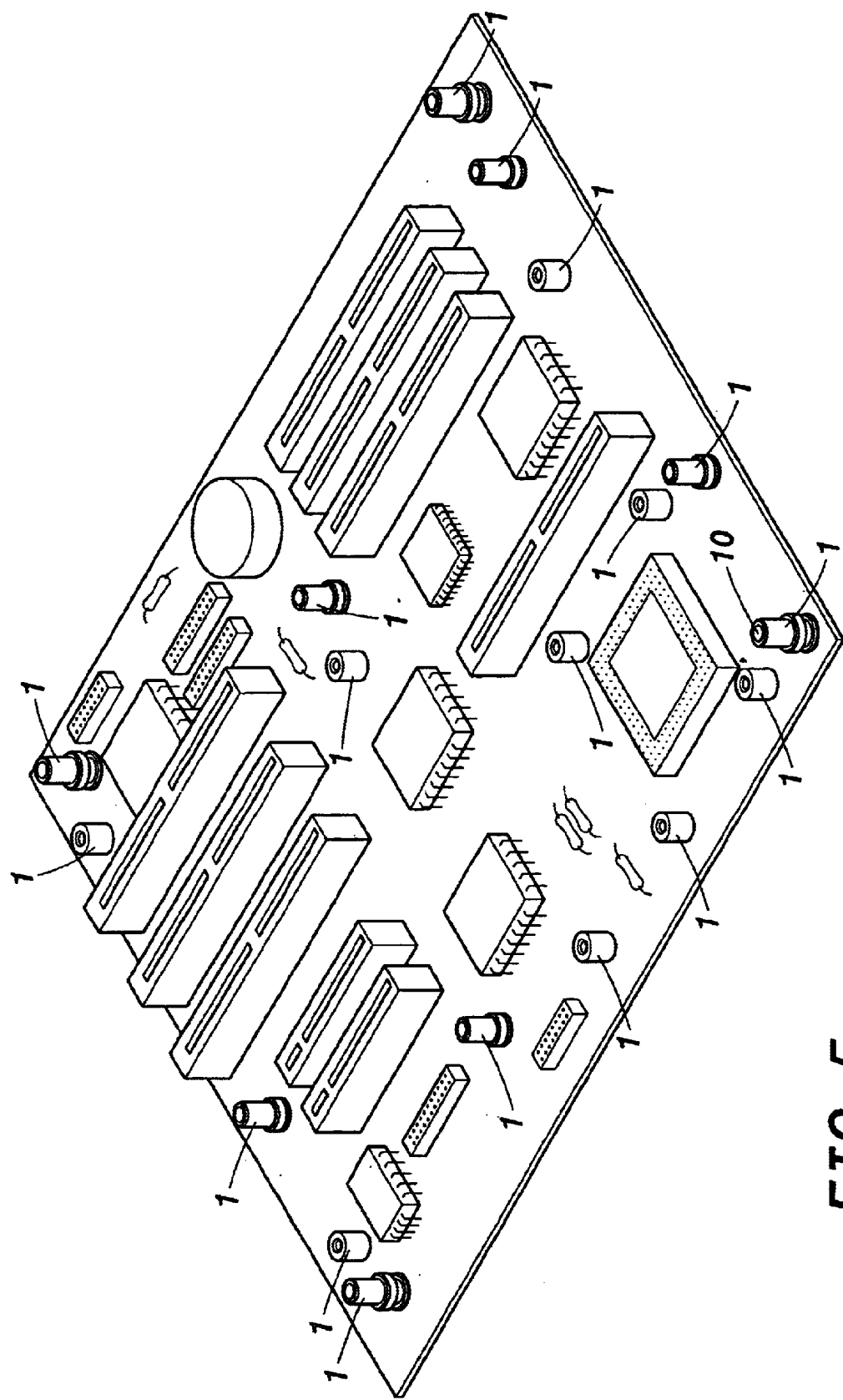
FIG. 5 is an elevational view showing different forms of female screw devices installed in a motherboard according to the present invention.
Figure 6:
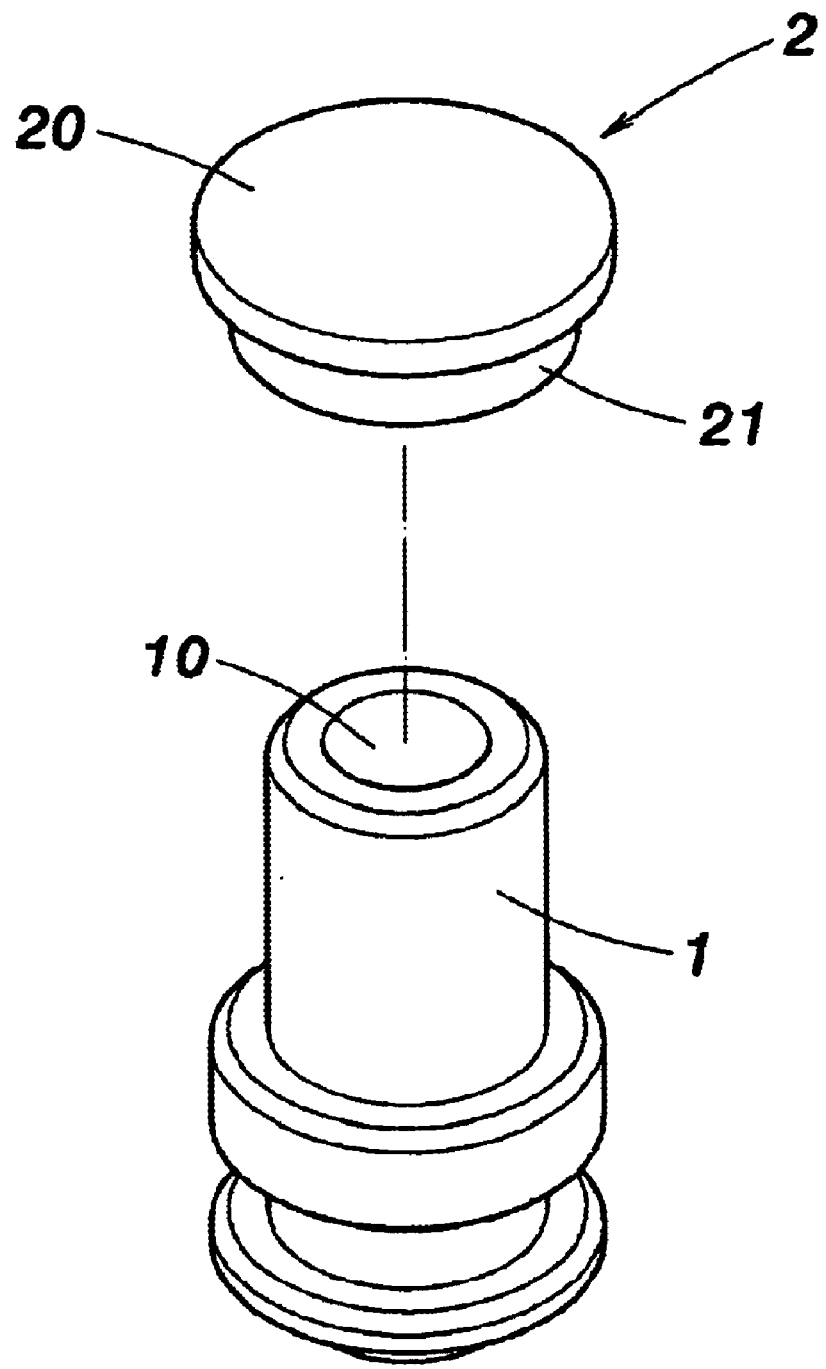
FIG. 6 is an exploded view of an alternate form of the female screw device according to the present invention.
Figure 7:
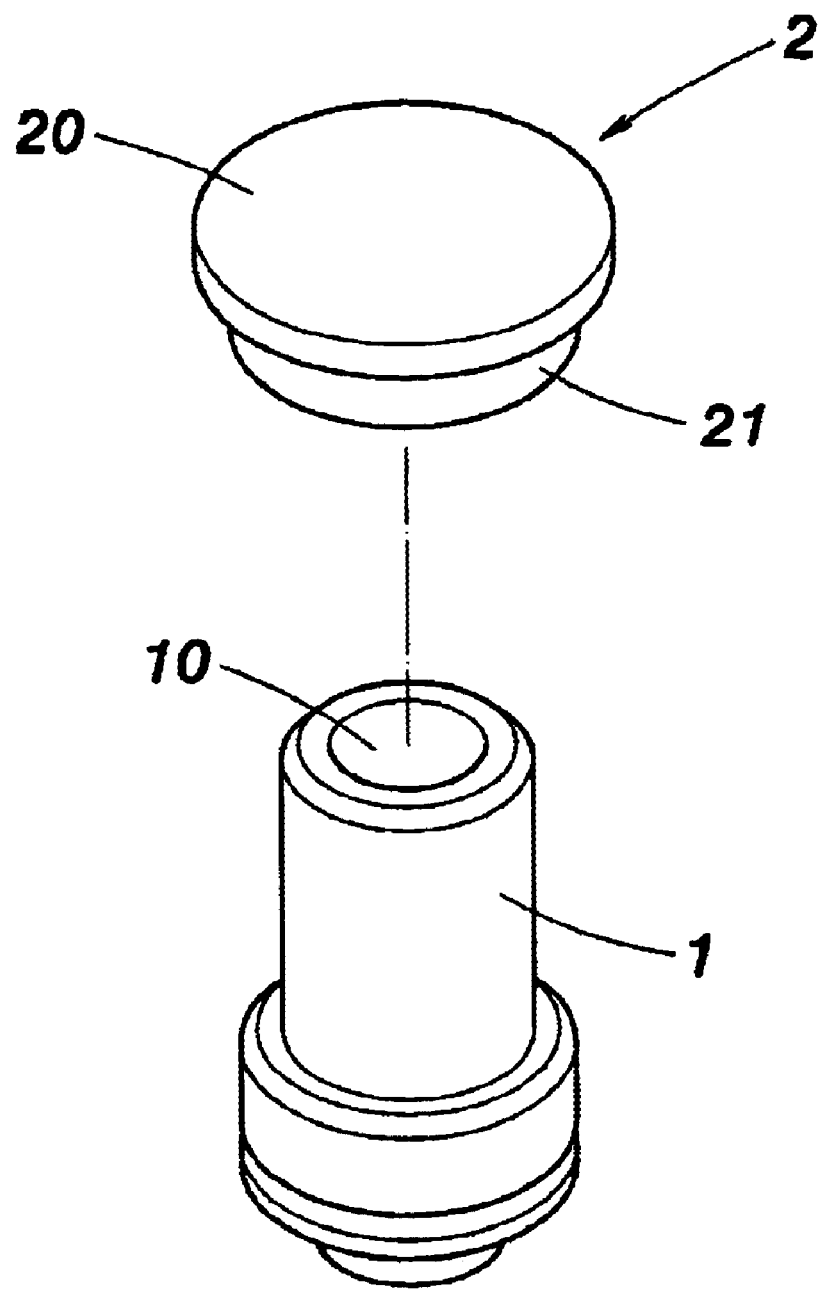
FIG. 7 is an exploded view of another alternate form of the female screw device according to the present invention.

FIG. 5 shows an application example of the present invention. The screw rod 1 shown in FIGS. 1~4 is designed for installation in a motherboard around the CPU at the motherboard, i.e., the screw rod 1 has a cylindrical shape. FIGS. 6 and 7 show two different alternate forms of the female screw rod 1 according to the present invention. Any change in shape of the female screw rod 1 does not affect the function of the female screw device for SMT automatic installation.

A prototype of female screw device has been constructed with the features of the annexed drawings of FIGS. 1~7. The female screw device functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A female screw rod structure adapted to a SMT automatic machine for attracting and picking up the female screw rod to assemble on a motherboard, comprising:

a female screw rod having a bottom portion mounted in a mounting hole of the motherboard to support an object above said motherboard, and said female screw rod having a screw hole axially extended through top and bottom sides thereof; and a quick-release cap detachably connectable to a top portion of said female screw rod, and said quick-release cap having a cap body for sealing the screw hole of said female screw rod and a coupling portion downwardly extended from a bottom side of said cap body for coupling on a circumference of the top portion of said female screw rod.

2. The female screw device as claimed in claim 1, wherein said quick-release cap is made of plastic material.

3. The female screw device as claimed in claim 1, wherein said hollow coupling portion of said quick-release cap is shaped like a barrel fitting the outer diameter of said female screw rod.

* * * * *